(12) United States Patent
Krampotich et al.

(10) Patent No.: US 6,206,196 B1
(45) Date of Patent: Mar. 27, 2001

(54) DOOR GUIDE FOR A WAFER CONTAINER

(75) Inventors: Dennis J. Krampotich, Shakopee; David L. Nyseth, Plymouth, both of MN (US)

(73) Assignee: Fluoroware, Inc., Chaska, MN (US)

( * ) Notice: Subject to any disclaimer, the term of this patent is extended or adjusted under 35 U.S.C. 154(b) by 0 days.

(21) Appl. No.: 09/226,372

(22) Filed: Jan. 6, 1999

(51) Int. Cl.$^7$ .................................................. B65D 85/48
(52) U.S. Cl. ........................... 206/711; 206/454; 220/801
(58) Field of Search .................................. 206/710–712, 206/454, 832; 118/500; 49/475.1, 479.1; 211/41.18; 220/796, 800, 801

(56) References Cited

U.S. PATENT DOCUMENTS

| | | | |
|---|---|---|---|
| 3,107,838 | * 10/1963 | Brys et al. ............................. | 220/800 |
| 3,679,089 | * 7/1972 | Swett et al. ........................... | 220/801 |
| 5,390,811 | * 2/1995 | Ogino et al. .......................... | 206/711 |
| 5,611,452 | * 3/1997 | Bonora et al. ........................ | 206/710 |
| 5,711,427 | * 1/1998 | Nyseth .................................. | 206/710 |
| 5,788,082 | * 8/1998 | Nyseth .................................. | 206/710 |
| 5,957,292 | * 9/1999 | Mikkelsen et al. ................... | 206/710 |

* cited by examiner

Primary Examiner—Luan K. Bui
(74) Attorney, Agent, or Firm—Patterson, Thuente, Skaar & Christensen, P.A.

(57) ABSTRACT

A semiconductor wafer carrier has an enclosure with a door frame defining an opening for insertion and removal of wafers, a door for closing and sealing said opening, and separately formed door guides for controlling the interface between said door and the enclosure. In a preferred embodiment, the door guides each comprise a first body and a second body connected to each other by a web. Each body includes a door contacting portion and a door frame contacting portion. The door frame contacting portion has a sloped segment configured to slidingly, progressively, and cooperatively engage the door frame to properly position the door within door frame during closure with minimal particle generation by such contact. In this preferred embodiment, the guide is configured to be attached onto a corner edge of a door. In this arrangement, as the door is inserted into the door frame in the z-direction, the first and second bodies exert centering forces as needed in the x and y directions on corner portions of the door. Such centering forces are provided with minimal particle generation due to low particle generating characteristics of the guides.

10 Claims, 3 Drawing Sheets

DOOR GUIDE FOR A WAFER CONTAINER

BACKGROUND OF THE INVENTION

This invention relates to doors which seat into door frames, and in particular to guides which facilitate closure and centering of a door within the door frame of a semiconductor wafer transport module.

Semiconductor wafers are subjected to numerous steps during processing. This usually entails transporting a plurality of wafers from one workstation to another for processing by specialized equipment. As part of the processing procedure, wafers may be temporarily stored or shipped in containers to other plants or to end users. Such intra and extra movements may generate or expose the wafers to potential wafer ruining contaminants. In order to reduce the deleterious effect of contaminants on wafers, specialized containers have been developed to minimize the generation of contaminants and to isolate wafers from contaminants exterior to the containers. A principal feature common to these devices is that they are provided with removable doors or closures.

There are several problems associated with the above-mentioned wafer handling devices or containers. During the working life of a container, the closure or door is attached and removed many times by both robotic and manual means. With each attachment and removal, a portion of the door edge may scrape against the door frame of the container. This can result in the generation of loose particles which may become airborne to lodge on the wafers being contained.

Equally important, doors of wafer handling devices or containers typically include cushions or channels which contact and support wafer edges. Optimally, such cushions or channels are designed to operate in concert with wafer receiving channels in the containers to securely retain a plurality of wafers. If a door is not, and cannot be accurately and repeatedly centered within a door frame, excessive contact and subsequent particle generation between the door cushions or channels and wafers may occur.

The problem of particle generation may also be attributed to the process by which doors and containers are manufactured. Containers and doors are usually formed by injection molding with plastic such as polycarbonate. Inherent in such molding is shrinkage and warpage of the molded parts. Although plastic injection molding techniques are highly advanced, there still may be individual deviations between different components from the same mold. While slight deviations do not generally compromise the function of a door in closing a container, they can change the working dimensions to the extent that contact (and the resultant particle generation) between a door and a door frame is increased. Dimensional changes can also be generated by the dies themselves, as a result of normal wear and tear. This problem is accentuated when the tolerances of the components of doors and containers are stacked or added.

As the semiconductor industry has evolved, wafers, and thus wafer carriers have increased significantly in size. Semiconductor fabrication facilities are now processing 300 mm wafers. The larger carriers for 300 mm wafers amplify the warpage, shrinkage, and tolerance issues in molded carriers.

Yet another problem occurs because these wafer carriers are robotically opened and closed. The carriers will be opened by multiple pieces of equipment which may each be set up slightly different. Also such equipment may go out of adjustment and is subject to wear and tear. Such equipment may not then be perfectly aligned resulting in undesirable and/or excessive door-frame contact and a situation of excessive abrasion and/or particle generation.

The present invention ameliorates the problems inherent to the above-mentioned wafer containers by providing low particle generating guides which may be attached to the edge of a container door.

SUMMARY OF THE INVENTION

A semiconductor wafer carrier has an enclosure with a door frame defining an opening for insertion and removal of wafers, a door for closing and sealing said opening, and separately formed door guides for controlling the interface between said door and the enclosure. In a preferred embodiment, the door guides each comprise a first body and a second body connected to each other by a web. Each body includes a door contacting portion and a door frame contacting portion. The door frame contacting portion has a sloped segment configured to slidingly, progressively, and cooperatively engage the door frame to properly position the door within the door frame during closure with minimal particle generation by such contact. In this preferred embodiment, the guide is configured to be attached onto a corner edge of a door. In this arrangement, as the door is inserted into the door frame in the z-direction, the first and second bodies exert centering forces as needed in the x and y directions on corner portions of the door. Such centering forces are provided with minimal particle generation due to low particle generating characteristics of the guides.

In a preferred embodiment, the sloped segment of a body is designed to progressively engage or urge a door away from a door frame as the door is centered and/or seated in the door frame. The preferred sloped segment has two surface portions with different camming efficiencies, or slopes, with a first surface portion having a relatively larger slope when compared to the second surface portion. Although the preferred sloped segment is depicted as having two generally linear surfaces, it is understood that other surface profiles may be used. For example, the sloped segment could be a single linear camming surface or a non-linear camming surface in the form of an arc or involute.

When a plurality of bodies have been positioned at appropriate locations around the perimeter of a door, they work in concert with each other to effectively, accurately and quickly center and/or seat a door within a frame. That is, when guides having first and second bodies are attached at each corner of a door, the ends of each facet or side of the door are effectively urged away from a corresponding door frame facet or side by a similar distance, thus centering the door within a door frame.

In a preferred embodiment, the web, which connects the first and second bodies to each other, may perform several functions. One function is to position the first and second bodies for optimum effectiveness. That is, positioning the door contacting surfaces of the first and second bodies against the door, and positioning the door frame contacting surfaces of the first and second bodies so that they project toward the door frame edge. Another function of the web is to attach and retain the guide on the edge of a door. Attachment of a guide onto a door edge is achieved through interaction of the first and second bodies as they are biased against notches in the door edge. Specifically, the door contacting portions of the first and second bodies each include an engagement portion which extends along the inwardly facing length of each body. These engagement portions are configured to be received in collateral notches formed in the sides or facets of the door and retained in their respective notches by the biasing force exerted by the resilient web. A guide may be attached onto a corner of a door by flexing the web and snapping the engagement portions into their respective notches, in the manner of a spring clip. Thus no external fasteners are required for the attachment.

In preferred embodiments, the guides are preferably composed from a mixture of polyetheretherketone (PEEK) and polytetrafluoroethylene (PTFE) in ratios of around 80% and 20%, respectfully. This material is relatively harder than the typical door and/or container material such as polycarbonate. Moreover, it has very favorable particle generating characteristics minimizing particle generation during door-edge to door-frame engagement. It also, by virtue of its relatively low level of frictional resistance, reduces the level of force needed to insert and remove a door from a container.

While the guide of a preferred embodiment of the invention comprises a first body and a second body connected to each other by a web, alternative embodiments are within the scope of the invention. For example, the guide may comprise a singular body or a train of bodies which are attachable onto the door at various locations such as the sides, corners or a combination of sides and corners. Moreover, attachment of the guide or guides need not be restricted to the biasing action of an arcuate web which causes portions of the first and second bodies to be retained on the door. Other embodiments could utilize, for example, complementary fasteners, adhesives, weldments, and threaded fasteners.

There may be instances where the fit between a door and a door frame is less than ideal, and the seam or space between a door and a door frame varies slightly. For example, a door and/or door frame may be warped or skewed with respect to each other. Such an irregular seam or fit may prevent optimal centering of the door within a frame using a set of similarly sized guides. In such instances, the guides may be available in an array of varying sizes to permit optimal positioning of a particular door within a particular door frame.

In alternate embodiments, the guides may be attached to the door frames in addition to or rather than the doors. Where the guides are attached to both the door and door frame, the guides may be attached in an offset or face to face cooperating relation.

It is an object of particular embodiments of the present invention to provide the door of a wafer container with removable door guides.

Another object of particular embodiments of the present invention is to reduce the amount of particulates generated by frictional contact between a door and a door frame.

Another object of particular embodiments of the present invention is to facilitate centering of a door within a door frame.

Yet another object of particular embodiments of the present invention is to reduce the amount of particulates generated by frictional contact between door mounted cushions and semiconductor wafer edges.

Still another object of particular embodiments of the present invention is to increase permissible tolerances between a door and a door frame.

An advantage of particular embodiments of the present invention is that guides may be removably attached at various locations on a door.

A feature of the particular embodiments of the invention is that the guides are fabricated out of a relatively hard and low friction material which resists wear.

Additional objects, advantages, and features of various embodiments of the invention will be set forth in part in the description which follows, and in part will become apparent to those skilled in the art upon examination of the following or may be learned by practice of the invention. The objects and advantages of various embodiments of the invention may be realized and attained by means of the instrumentalities and combinations particularly pointed out in the appended claims.

The above figures are for illustrative purposes of particular embodiments of the invention and are not meant to limit the scope of the claimed invention.

DETAILED SPECIFICATION

Figure 1:
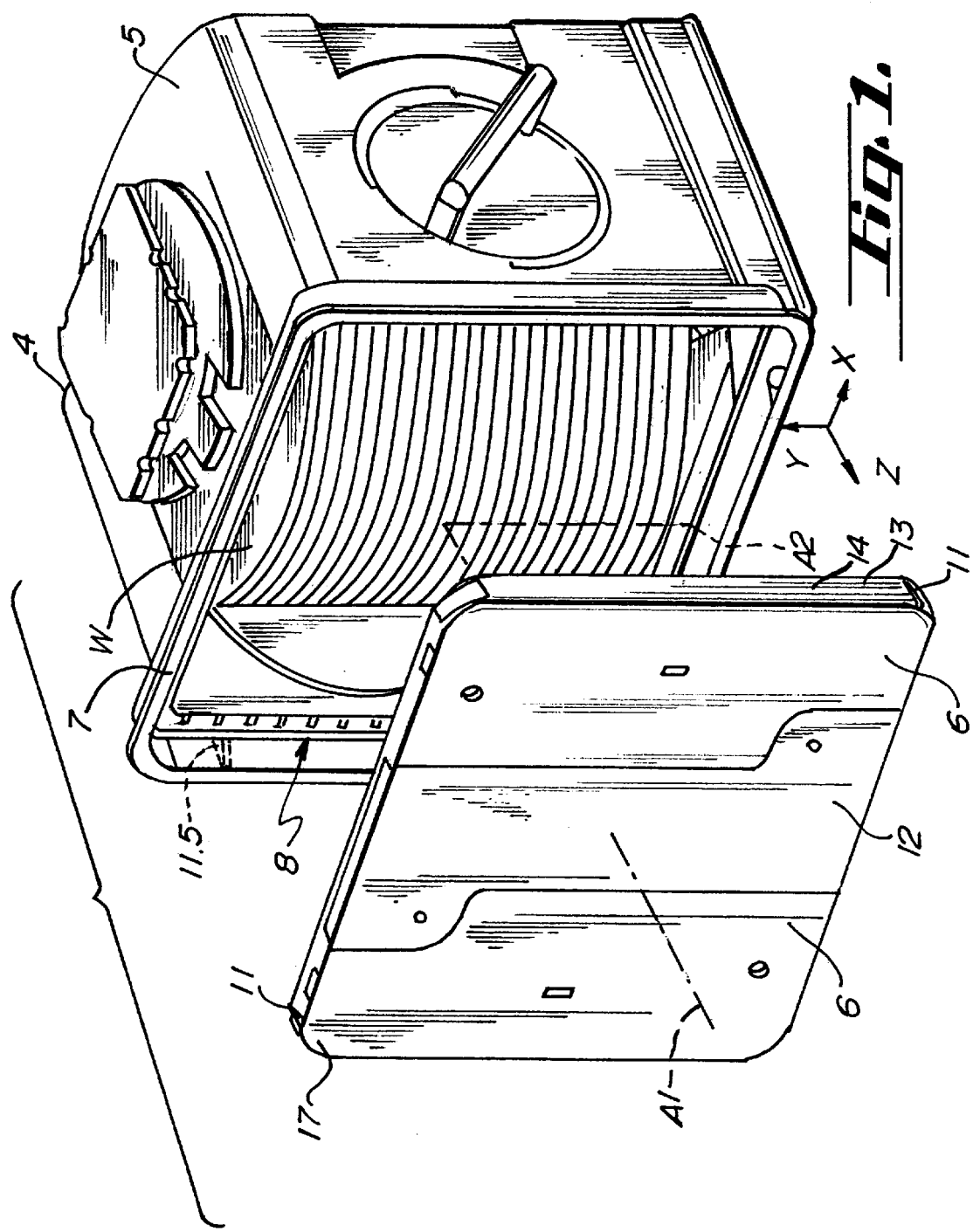
FIG. 1 is a perspective view of a wafer container with a door having door guides according to the invention.

A depicted in FIG. 1, a wafer carrier configured as a wafer container 4 holds a plurality of wafers W and is principally comprised of an enclosure portion 5 and a door or closure 6. The enclosure portion has a door frame 7 that defines an opening 8 for insertion and removal of the wafers. The door 6 has a plurality of guides 11 attached thereto. Door 6 is of a typical configuration having an exterior surface 12, a periphery 13 with four sides 14, and an interior surface 16 (see FIGS. 2A, 2B). The door 6 is configured to close and seal the opening 8 and seats within the door frame 7. The door has an axis A1 and the door frame has an axis A2. For proper positioning of the door into the door frame, the axes should be aligned and the door moved axially. The guides operate to radially adjust the position of the door for proper alignment. Stated another way, referencing the X-Y-Z coordinate axis, the door is inserted in the Z direction and is positioned in the X and Y directions by the door guides 11 for proper axial alignment.

Figure 2A:
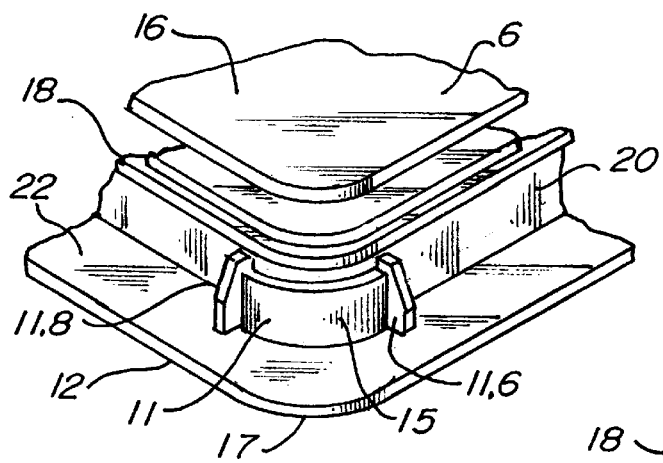
FIG. 2A is a perspective view of a corner of a door showing a guide attached to the door edge.

Referring to FIG. 2A, a guide 11 is shown attached to a corner 17 of the door 6. As can be seen, the guide 11 comprises a first body 11.6 and a second body 11.8 connected to each other by an arcuately shaped web 15. The web 15 positions first and second bodies 11.6, 11.8 on either side of the corner 17 of the door 6 so that they may engage corresponding sides of a door frame. The bodies 11.6, 11.8 are somewhat wedge-shaped in profile (see FIG. 4) and oriented so that they become progressively thicker in the direction from the interior surface 16 to the exterior surface 12 of the door 6.

Figure 2B:
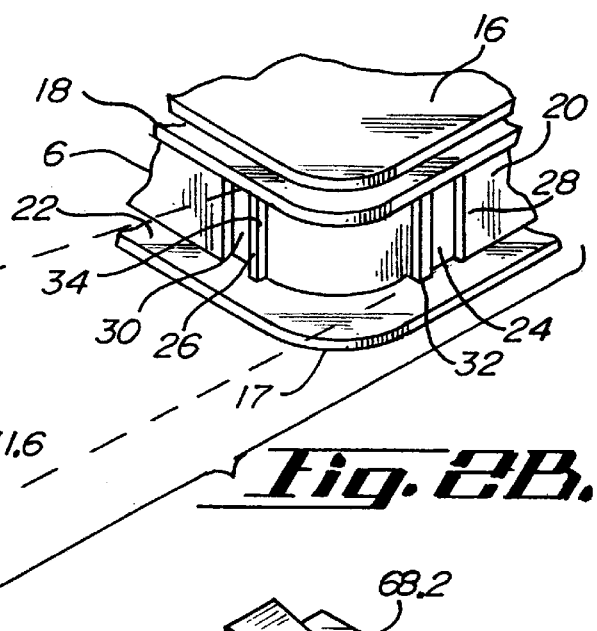
FIG. 2B is an exploded view of FIG. 2A.

Referring to FIG. 2B, the guide 11 is shown spaced from the corner of the door 6. As can be seen, a wall 20 of the door 6 is provided with notches 24, 26 positioned between a pair of flanges 18, 22. The notches 24, 26 are configured to receive the engagement portions 79, 99 (shown in FIG. 3A as the intersections of body contacting portions 62, 82 and interior side walls 76, 96, respectively) of bodies 11.6, 11.8 for attachment of guide 11 to door 6. As will be appreciated, engagement portions 79, 99 are maintained in engaging contact with the notches 24, 26 by biasing action of the web 15 of the guide 11 which acts as a spring element provided by the resilient characteristic of the rigid plastic.

Figure 3A:
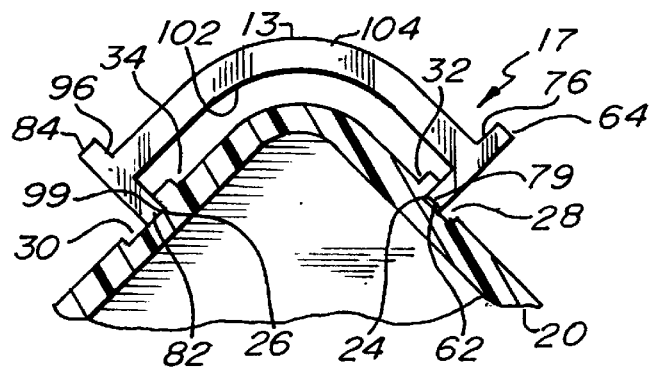
FIG. 3A is a partial, sectional, end view of a guide of the present invention attached onto a corner of a door.
Figure 3B:
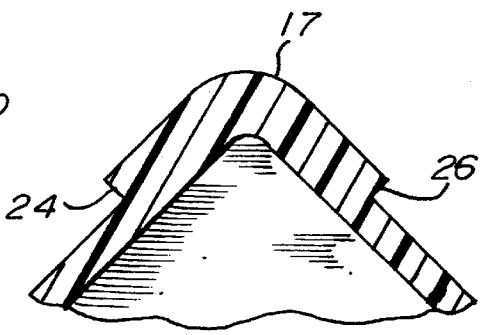
FIG. 3B is a partial sectional of an alternative corner configuration.
Figure 3C:
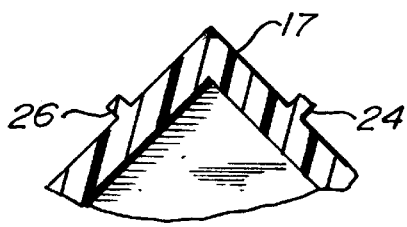
FIG. 3C is a partial sectional of an alternative corner configuration.

Referring to FIG. 3A, the notches 24, 26 are defined by a pair of channels 28, 30 and a pair of ribs 32, 34, with the ribs 32, 34 extending along and adjacent to inner sides of the channels 28, 30. As can be seen, the notches 24, 26 face away from each other by a specific distance. Note that the distance between the engagement portions 79, 99 is ideally less than or equal to the distance between the notches 24, 26. Thus, to attach the guide 11 onto the door 6, the distance between the engagement portions 79, 99 has to exceed the distance between the notches 24, 26. This may be accomplished by flexing the relatively resilient web 15 an appropriate distance to the point where the engagement portions 79, 99 may be placed into sliding contact with the notches 24, 26 and allowed to seat themselves under the biasing force exerted by the web 15. Note that web 15 is sufficiently spaced from the engagement portions 79, 99 so that the interior surface 102 does not come into contact with the wall 20 of the door 6. This spacing also allows the engagement portions to be fully seated in the notches 24, 26. Correspondingly, the exterior surface 104 of the web 15 is also sufficiently spaced from the door frame contacting portions 64, 84 of the bodies 11.6, 11.8 to allow unimpeded contact between door frame contacting portions 64, 84 and intersecting sides of a door frame. Referring to FIGS. 3B and 3C, alternate versions of the door corner are shown with the notches 24, 26 are shown.

Figure 4:
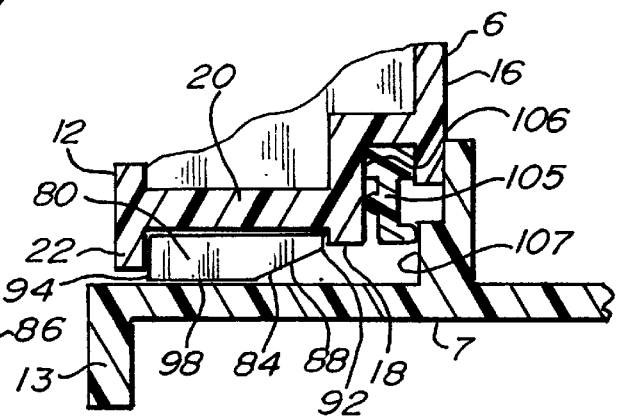
FIG. 4 is a partial, sectional, view of the side of a door seated with a door frame in accordance with the invention.
Figure 5:
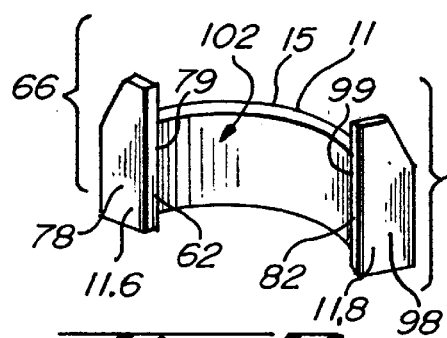
FIG. 5 is a perspective view of an alternative configuration of a door guide.

Referring to FIGS. 4 and 5, a cross section illustrates the seating of the door 6 with the door frame 7. An elastomeric seal 105 is positioned in a groove 106 contacts a sealing surface 107 of the door frame. The body 11.8 of the guide 11 includes a door contacting portion 82 and a door frame contacting portion 84. The door frame contacting portion 84 includes a sloped segment 86 (see FIG. 5) which, in turn, includes a first camming surface 88 and a second camming surface 90. The body 11.8 also includes a pair of ends 92, 94 which are adjacent flanges 18, 22, an interior side 96 and an exterior side 98 (see FIG. 5). As can be seen, the ends 92, 94 extend slightly beyond the edges of the flanges 18, 22 to expose the greatest extent of the door frame contacting surface 84 for engagement with a door frame. The ends 92, 94 also serve to prevent unnecessary and/or inadvertent linear movement within the notch 24.

Turning to FIG. 5, the first and second bodies 11.6, 11.8 of the guide 11 are oriented by the web 15 so that the sloped surfaces 66, 86 are perpendicular to the intersecting walls of the door frame. In this instance, first and second bodies are orthogonally aligned with respect to each other. However, it is understood that the alignment is dependent upon the number and configuration of the facets or the sides in a door.

Figure 6:
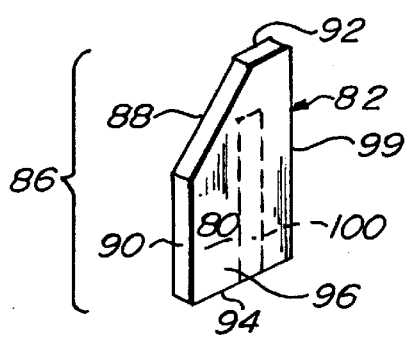
FIG. 6 is a perspective, isolated view of the web attachment side of the second body of the guide, with the web attachment location shown in dashed lines.

Referring to FIG. 6, the web 15 connecting location is depicted in dashed lines on the interior side 86 of the body 11.8. Although such connection location is adjacent the engagement portion 99, the web 15 may be connected at other locations.

Figure 7:
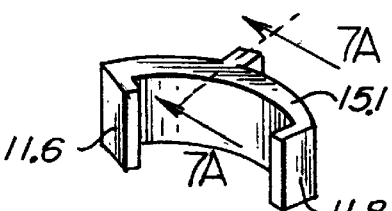
FIG. 7 is a perspective view of an alternative door guide.
Figure 7A:
FIG. 7A is a cross sectional view taken at line 7A—7A of FIG. 7.

Referring to FIGS. 7 and 7A, an alternate configuration of the door guide 11 is shown that has a single cammed surface 68.1 positioned in the center of the web 15.1.

Figure 9A:
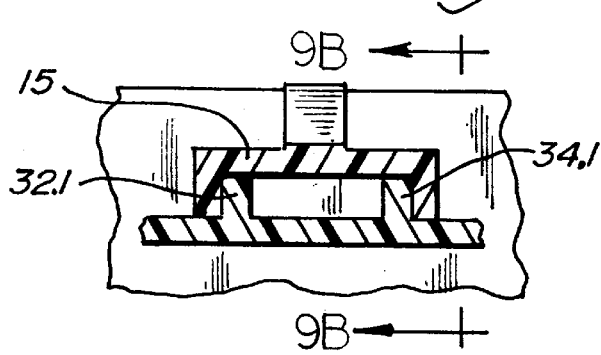
FIG. 9A is a cross-sectional view taken at line 9A—9A of FIG. 9B illustrating the guide of FIG. 8 in position on a door.
Figure 8:
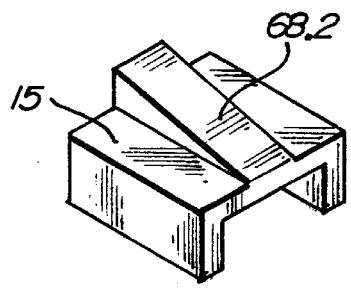
FIG. 8 is a perspective view of an alternative configuration a door guide suitable for use on the sides of a door or door frame.
Figure 9B:
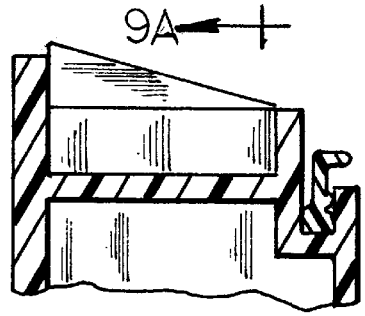
FIG. 9B is a cross-sectional view taken at line 9B—9B of FIG. 9A illustrating the guide of FIG. 8 in position on a door.

Referring to FIGS. 8, 9A, and 9B, an embodiment of the door guide which may be positioned on one of the sides 14 of the door is shown. The ribs 32.1 and 34.1 defining the notches 24.1 and 26.1 may have a slight undercut to retain the guide in place.

Referring to FIG. 1, the plurality of door guides are positioned on at least one of the door periphery and the door frame and may be mounted on the door frame as illustrated with the guide identified with the numeral 11.5.

The present invention may be embodied in other specific forms without departing from the spirit of essential attributes thereof; and it is, therefore, desired that the present embodiment be considered in all respects as illustrative and not restrictive, reference being made to the appended claims rather than to the foregoing description to indicate the scope of the invention.

We claim:

1. An improved wafer enclosure for holding wafers, the enclosure comprising an enclosure portion with a door frame defining an open side and a door with a periphery for engaging with the door frame, the enclosure having a flexible seal between the door and door frame, the improvement comprising a plurality of rigid, abrasion resistant door guides separately formed from the door and door frame, each said door guide positioned on a portion of at least one of the door periphery and the door frame for providing an interface surface between the door periphery and the door frame, wherein each of the door guides comprises an integral resilient web portion and wherein each of the door guides are secured to the door at the door periphery by way of its respective resilient web.

2. An improved wafer enclosure for holding wafers, the enclosure comprising an enclosure portion with a door frame defining an open side and a door with a periphery for engaging with the door frame, the enclosure having a flexible seal between the door and door frame, the improvement comprising a plurality of rigid, abrasion resistant door guides separately formed from the door and door frame, each said door guide positioned on a portion of at least one of the door periphery and the door frame for providing an interface surface between the door periphery and the door frame, wherein the door guides are comprised principally of polyetheretherketone and are further comprised of polytetrafluoroethylene.

3. An improved wafer enclosure for holding wafers, the enclosure comprising a box portion with a door frame defining an open side and a door with a periphery for engaging with the door frame, the enclosure having a flexible seal between the door and door frame, the improvement comprising a plurality of abrasion resistant door guides separately formed from the door and door frame, each said door guide having a resilient portion for snapping onto said door frame without the use of separate fasteners.

4. An improved container for holding wafers, comprising:

a box portion including a door frame;

a door with a periphery for engaging the door frame; a plurality of attachable, rigid, abrasion resistant door guides separately formed from the door and the door frame, each said door guide positioned on a portion of at least one of the door periphery and the door frame for providing interface surfaces between the door periphery and the door frame to center the door during closure, the door guides comprising polytetrafluoroethylene and polyetheretherketone.

5. The improved container of claim 4, in which said polyetheretherketone is present in an amount of about 80 percent.

6. The improved container of claim 4, in which said polytetrafluoroethylene is present in an amount of about 20 percent.

7. An improved container for holding wafers, comprising:
a box portion including a door frame;
a door with a periphery for engaging the door frame; and a plurality of attachable, rigid, abrasion resistant door guides separately formed from the door and the door frame, each said door guide positioned on a portion of at least one of the door periphery and the door frame for providing interface surfaces between the door periphery and the door frame to center the door during closure, each said door guide comprising first and second bodies and a web, each said first and second body comprising a contacting portion, the web connecting the first body and second body, each contacting portion including a sloped segment, said first and second body contacting portions cooperatively engageable to center the door during closure.

8. The improved container of claim 7, each said body contacting portion further including a first camming surface and a second camming surface, said first and second camming surfaces providing different rates of displacement as the door engages the door frame.

9. The improved container of claim 7, in which said web is an arcuately shaped biasing element.

10. The improved container of claim 7, in which the first and second bodies comprise about 11.8 percent polyetheretherketone and about 20 percent polytetrafluoroethylene.

* * * * *